(12) United States Patent
Terui

(10) Patent No.: US 7,102,227 B2
(45) Date of Patent: Sep. 5, 2006

(54) PASSIVE ELEMENT CHIP AND MANUFACTURING METHOD THEREOF, AND HIGHLY INTEGRATED MODULE AND MANUFACTURING METHOD THEREOF

(75) Inventor: Makoto Terui, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/766,896

(22) Filed: Jan. 30, 2004

(65) Prior Publication Data

US 2005/0093142 A1   May 5, 2005

(30) Foreign Application Priority Data

Oct. 31, 2003   (JP) .............................. 2003-373803

(51) Int. Cl.
*H01L 23/34* (2006.01)
(52) U.S. Cl. ...................................... 257/724; 257/723
(58) Field of Classification Search ................ 257/723, 257/724, 686
See application file for complete search history.

(56) References Cited

U.S. PATENT DOCUMENTS

| 5,111,278 A * | 5/1992 | Eichelberger ............... 257/698 |
| 6,582,991 B1 * | 6/2003 | Maeda et al. ................ 438/107 |
| 6,603,210 B1 * | 8/2003 | Kishimoto et al. ......... 257/781 |
| 6,853,559 B1 * | 2/2005 | Panella et al. .............. 361/764 |
| 2002/0122244 A1 * | 9/2002 | Sotgiu et al. ............. 359/341.3 |
| 2003/0098505 A1 | 5/2003 | Kimura et al. |
| 2003/0122244 A1 * | 7/2003 | Lin et al. ..................... 257/700 |
| 2003/0151136 A1 * | 8/2003 | Ji ............................... 257/724 |
| 2004/0021218 A1 * | 2/2004 | Hayama et al. ............. 257/700 |

FOREIGN PATENT DOCUMENTS

JP   2002-261449   9/2002

* cited by examiner

*Primary Examiner*—Nitin Parekh
(74) *Attorney, Agent, or Firm*—Nixon Peabody LLP; Donald R. Studebaker

(57) ABSTRACT

A passive element chip permits a reduced size and a higher packaging density to be achieved. The passive element chip has a substrate, a plurality of passive elements formed by metal wires on the substrate, and electrodes for electrically connecting the plurality of passive elements to an external source. The passive elements are isolated from each other.

18 Claims, 11 Drawing Sheets

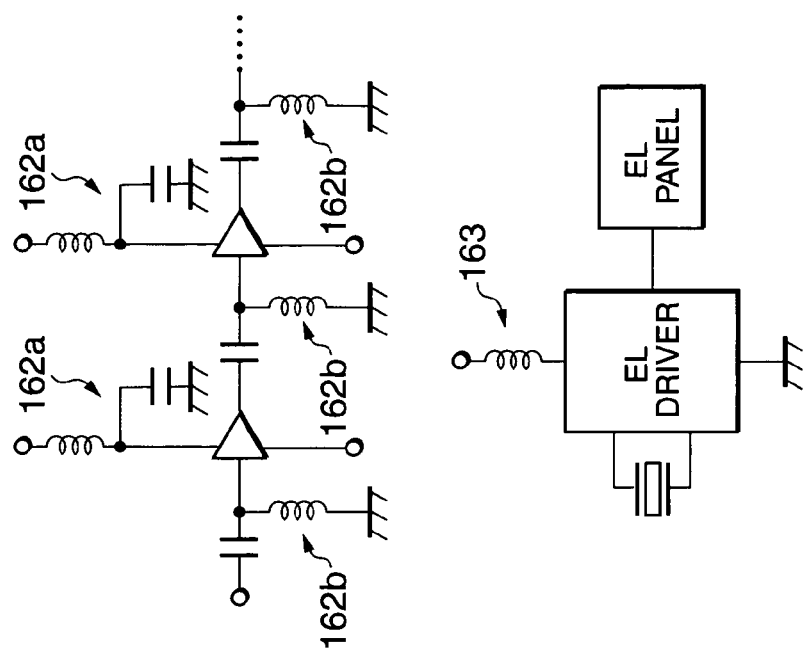
Fig. 10C
Fig. 10D
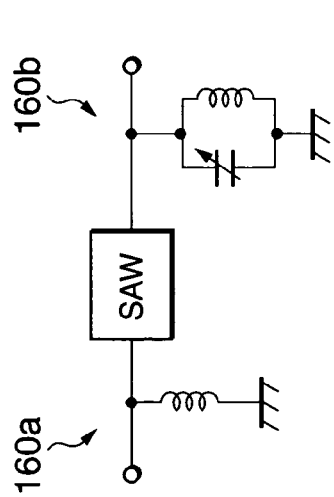
Fig. 10A
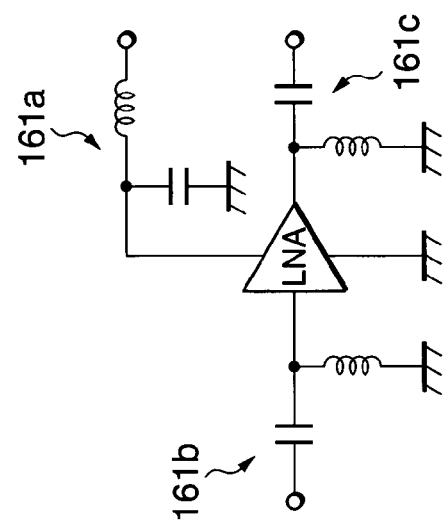
Fig. 10B

PASSIVE ELEMENT CHIP AND MANUFACTURING METHOD THEREOF, AND HIGHLY INTEGRATED MODULE AND MANUFACTURING METHOD THEREOF

BACKGROUND OF THE INVENTION

1. Field of the Invention

The present invention relates to a passive element chip and a manufacturing method thereof, and a highly integrated module and a manufacturing method thereof.

2. Description of the Related Art

To achieve a higher packaging density for electric equipment, there has been proposed a method for incorporating active elements, such as semiconductor chips, and passive elements, such as inductors, capacitors and resistors, in a substrate (self-contained substrate). The applications for such a self-contained substrate has been limited because it is difficult to guarantee that active elements or passive elements are nondefective once they are incorporated into a chip.

Patent Document 1, namely, Japanese Unexamined Patent Application Publication No. 2002-261449 (page 9, FIG. 1) has disclosed a self-contained module, which is fabricated by embedding a bare chip semiconductor device, inductors, capacitors and other passive elements in sheets made of a thermosetting resin and these sheets are bonded to form multi-layer laminate, and wiring patterns of the layers are electrically connected through inner via holes passing through the layers.

Patent Document 2, namely, Japanese Unexamined Patent Application Publication No. 2003-158214 (pages 3 to 6, FIGS. 1 and 2) has disclosed a wiring assembly (self-contained module) that has substantially the same shape as that of one surface of a semiconductor device. The wiring assembly includes a semiconductor element interface circuit. Inductors, capacitors, resistors and other passive elements required for the interface circuit are embedded in the wiring assembly. More specifically, a groove is formed in a surface of the semiconductor device, which is adjacent to a terminal, and a wiring pattern and passive elements, such as inductors, capacitors, and resistors, are placed in the groove.

In the self-contained modules disclosed in Patent Documents 1 and 2, the passive elements are included in a thermosetting resin or the like in the form of individual chip components. However, including individual chip components requires a large area for the chip components themselves and the wires extended among the chip components. As the number of passive elements increases, the completed module incorporating them will be undesirably large.

It could be possible to reduce the number of passive elements by building passive elements into a semiconductor chip in a semiconductor process. However, forming passive elements originally mounted in discrete form into a semiconductor chip would interfere with active elements, such as transistors and may adversely affect the characteristics of the active elements.

SUMMARY OF THE INVENTION

Accordingly, it is an object of the present invention to provide a passive element chip capable of integrating a plurality of discrete components into a single chip.

It is another object of the present invention to provide a highly integrated module that permits a higher packaging density to be achieved.

Still another object of the present invention is to provide a manufacturing method for passive element chips.

A further object of the present invention is to provide a manufacturing method for highly integrated modules.

To these ends, according to the present invention, there is provided a passive element chip including a substrate, a plurality of passive elements formed on the substrate by metal wires, and electrodes for electrically connecting the plurality of passive elements to an external source, wherein the passive elements are isolated from each other.

With this arrangement, a plurality of passive elements, which used to be discrete components, can be formed on a substrate to integrate the discrete components into a single passive element chip. Using such a passive element chip to constitute a self-contained module makes it possible to effectively reduce the area required for mounting the passive elements in a case where high-density packaging of the passive elements is required. This permits a reduction in the size of the highly integrated module and a higher packaging density to be accomplished.

The individual passive elements integrated in the passive element chip are mutually isolated and have electrodes for electrical connection to an external source. This arrangement allows the passive elements to be wired to proper locations in an electric circuit by selectively wiring their electrodes when installing the passive element chip in a self-contained module. Moreover, depending on a combination of wires of the electrodes, a plurality of passive elements can be combined to obtain a required specification (e.g., a resistance value, a capacitance value, an inductance value, or a quality factor).

BRIEF DESCRIPTION OF THE DRAWINGS

FIGS. 10A through 10D show examples of applications;

DESCRIPTION OF THE PREFERRED EMBODIMENTS

[Highly Integrated Module]

Figure 1A:
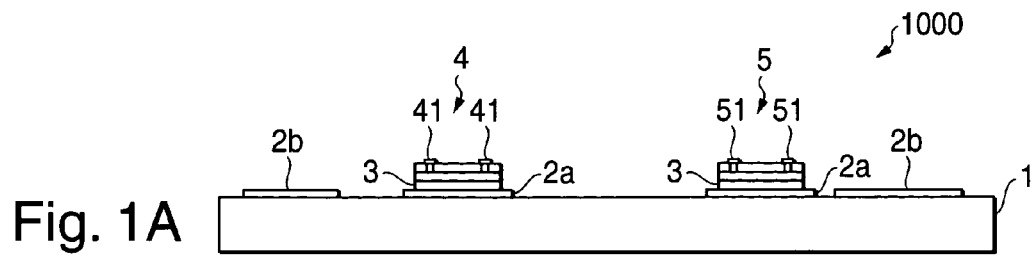
FIGS. 1A through 1D are explanatory diagrams showing steps of a manufacturing method for a highly integrated module.
Figure 1B:
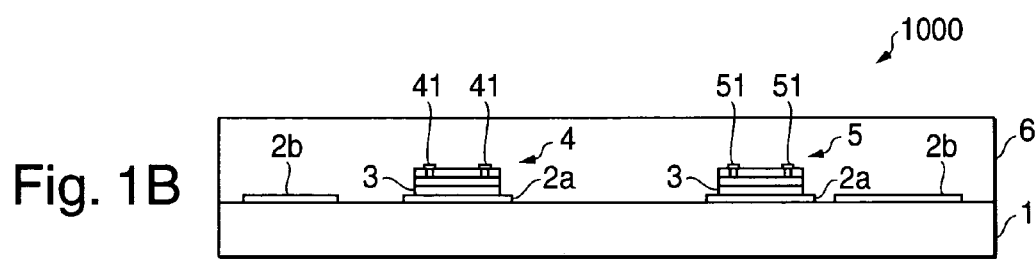
Figure 1C:
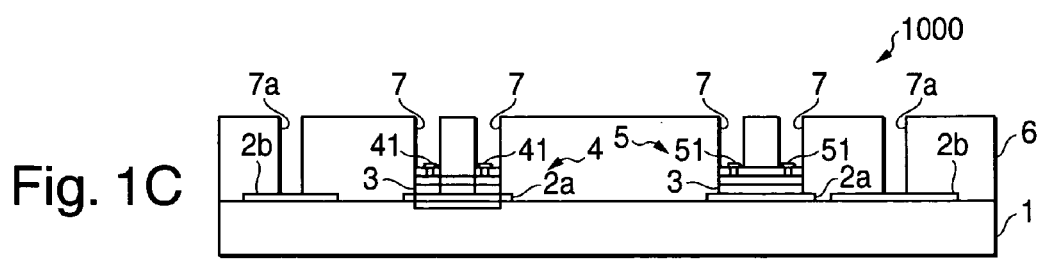
Figure 1D:
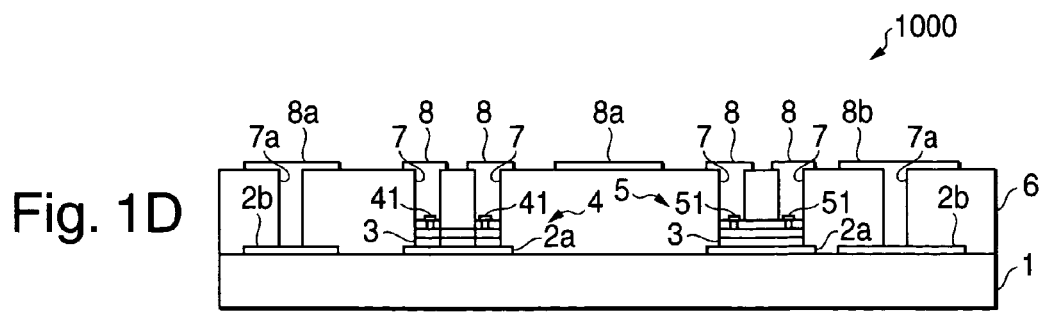
Figure 2A:
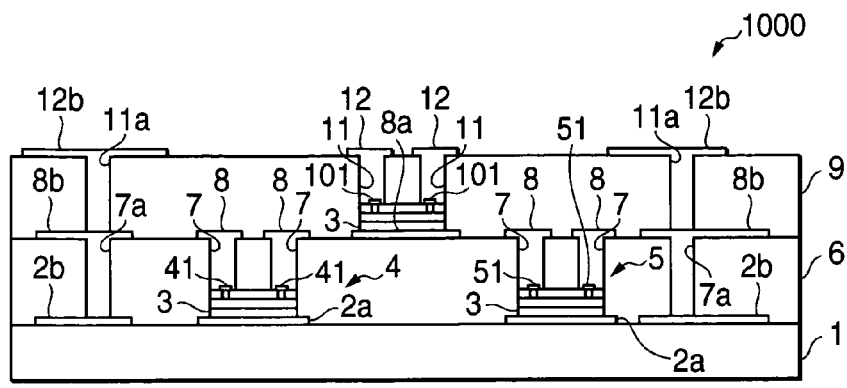
FIGS. 2A through 2C are explanatory diagrams showing steps of the manufacturing method for a highly integrated module.
Figure 2B:
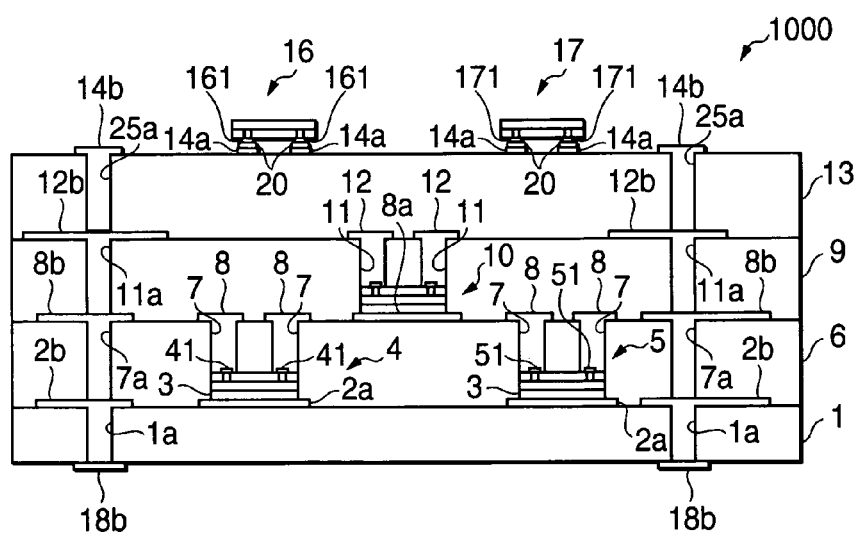
Figure 2C:
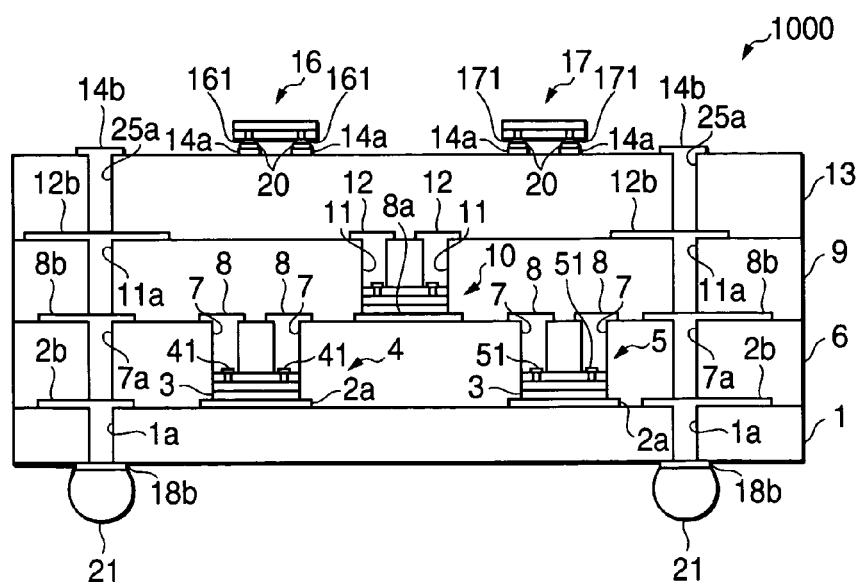

FIG. 1 and FIG. 2 show steps of a manufacturing method for a highly integrated module 1000 in accordance with a first embodiment of the present invention.

Referring to FIG. 1A, an electrically conductive film on the upper surface of an insulating substrate 1 is patterned to form a wiring pattern 2, wiring patterns 2a serving as seating patterns, and wiring patterns 2b to be pads for connecting wiring patterns of different layers. Then, a semiconductor device 4 and a passive element chip 5 are secured to the seating patterns 2a by die bonding members 3. The semiconductor device 4 is formed of a wafer level chip size package (WCSP) in which a semiconductor chip with active elements, such as transistors, formed thereon is rewired and sealed with a resin. The semiconductor device 4 has electrodes 41 for electrical connection with an external source. The passive element chip 5 is a WCSP fabricated by integrating a plurality of passive elements, including inductors, capacitors, and resistors, which are mounted separately from a semiconductor device, on a substrate, then rewired and sealed with a resin. The passive element chip 5 has electrodes 51.

A WCSP device or chip has metal posts (second electrodes) disposed at a larger interval than that of the electrode pads (first electrodes) of a bare chip, which is not sealed with a resin, and permits easier wiring with an external circuit. In a WCSP, the elements formed into chips are protected by resins, permitting easier handling, because they do not require a very high cleanliness level of its surrounding environment, as compared with bare chips. While elements in bare chips cannot be guaranteed as perfectly nondefectives, they can be guaranteed as perfectly nondefectives in the WCSP, because the large interval between the metal posts allows them to be connected to an external circuit to carry out testing.

Then, as shown in FIG. 1B, an insulating film 6 formed of a polyimide-based or epoxy-based resin or the like is deposited to cover the semiconductor device 4 and the passive element chip 5.

Thereafter, as shown in FIG. 1C, the insulating film 6 is etched to form openings 7 so as to expose the electrodes 41 of the semiconductor device 4 and the electrodes 51 of the passive element chip 5. The insulating film 6 is further etched to form openings 7a to expose the wiring patterns 2b.

Subsequently, as shown in FIG. 1D, an electrically conductive film formed of copper or the like is deposited over the insulating film 6 to cover the openings 7 and the openings 7a. The electrically conductive film is patterned to form wiring patterns 8, a wiring pattern 8a to be a seating pattern, and wiring patterns 8b to be pads for connecting wiring patterns of different layers. The electrodes 41 of the semiconductor device 4 and the electrodes 51 of the passive element chip 5 are electrically connected to the wiring patterns 8 through the openings 7. The wiring patterns 2b are electrically connected to the wiring patterns 8b through the openings 7a.

Next, as shown in FIG. 2A, a semiconductor device 10 is secured to the seating pattern 8a by the die bonding member 3. The semiconductor device 10 uses a WCSP in which a semiconductor chip having active elements, such as transistors, is sealed with a resin and rewired. The semiconductor device 10 has electrodes 101. Then, an insulating film 9 is deposited on the insulating film 6, and etched to form openings 11 so as to expose electrodes 101. Furthermore, the insulating film 9 is etched to form openings 11a to expose wiring patterns 8b. Subsequently, an electrically conductive film is deposited over the surface of the insulating film 9 to cover the openings 11 and the openings 11a. The electrically conductive film is patterned to form wiring patterns 12 and wiring patterns 12b to be pads for connecting wiring patterns of different layers. The electrodes 101 of the semiconductor device 10 are electrically connected to the wiring patterns 12 through the openings 11. The wiring patterns 8b are electrically connected to the wiring patterns 12b through the openings 11a.

In the next step, as illustrated in FIG. 2B, an insulating film 13 is deposited on the insulating film 9, and etched to form openings 25a so as to expose the wiring patterns 12b. Subsequently, an electrically conductive film is deposited over the surface of the insulating film 13 to cover the openings 25a. The electrically conductive film is patterned to form wiring patterns 14a to be seating patterns, and wiring patterns 14b for connecting wiring patterns of different layers. The wiring patterns 12b are electrically connected to the wiring patterns 14b through the openings 25a. Thereafter, electrodes 161 of a semiconductor device 16 are secured to the wiring patterns 14 by solders 20, and electrodes 171 of a passive element chip 17 are secured to the wiring patterns 14 by solders 20.

Furthermore, the back surface of the substrate 1 is etched to form openings 1a to expose the wiring patterns 2b. Subsequently, an electrically conductive film is deposited on the back surface of the substrate 1 to cover the openings 1a. The electrically conductive film is patterned to form wiring patterns 18b to be electrically connected to the wiring patterns 2b.

Lastly, solder balls 21 are formed on the wiring patterns 18b on the back surface of the substrate 1. The solder balls 21 are external connection terminals used for connection to external terminals.

The semiconductor device 16 is formed of a WCSP fabricated by sealing, with a resin, a semiconductor chip on which active elements, such as transistors, are formed, and rewired. The passive element chip 17 is formed of a WCSP fabricated by integrating passive elements, including inductors, capacitors, and resistors, which are mounted separately from a semiconductor device, into a semiconductor chip, then the semiconductor chip is sealed with a resin and rewired. A passive element chip 19 is a WCSP fabricated by integrating passive elements, including inductors, capacitors, and resistors, which are mounted separately from the semiconductor devices 4, 10 and 16, on a substrate, then the electrodes of the passive elements are rewired and sealed with a resin.

Figure 3:
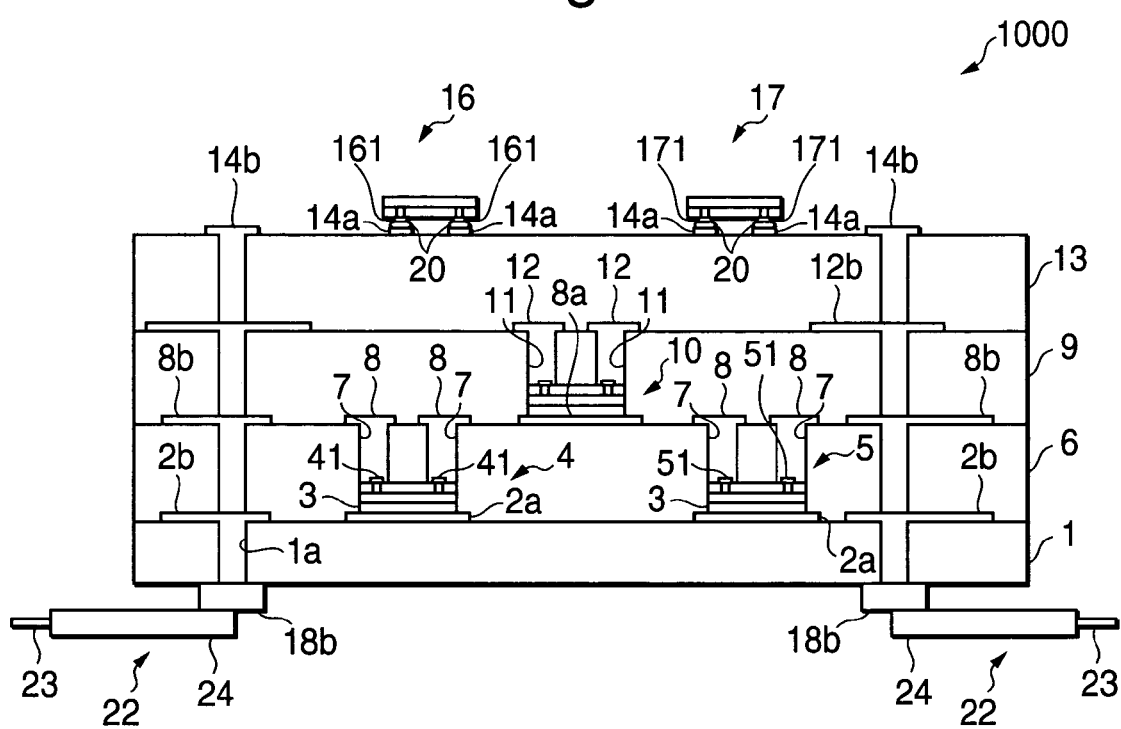
FIG. 3 is an explanatory diagram showing a step of the manufacturing method for a highly integrated module.

In the above description, the terminals for external connection are provided by the solder balls 21 formed on the back surface of the substrate 1; however, the terminals for external connection are not limited thereto. Alternatively, connectors or sockets or the like may be used for connection in a system, as in the case of a standard daughter board or a mother board. For example, as shown in FIG. 3, connectors 22 may be soldered to the wiring patterns 18b. The connectors 22 have pins 23 for connection with an external circuit, and external connection portions (not shown) electrically connected to the pins 23 are electrically connected to the wiring patterns 18b by solder. The connectors 22 are fitted to external terminals to electrically connect the wiring patterns 18b to external terminals.

In the above description, the semiconductor devices are composed of WCSPs. Alternatively, however, the semiconductor devices may be formed of bare chips. In the above description, the passive element chips are composed of the WCSPs. Alternatively, however, the passive element chips may be formed of bare chips.

[Passive Element Chip]

FIGS. 4 and 5 are cross-sectional views for explaining a manufacturing method for a passive element chip 500.

Figure 4A:
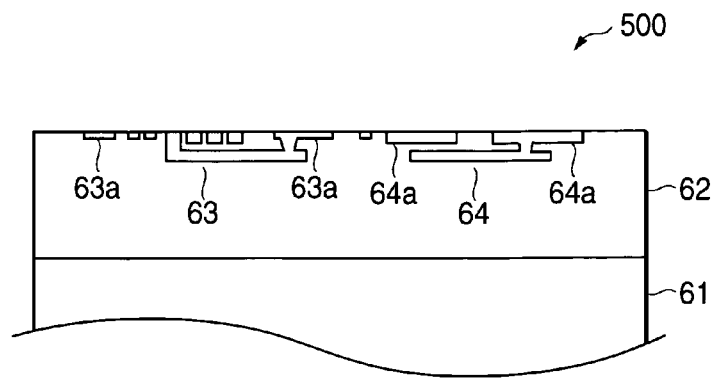
FIGS. 4A through 4C are explanatory diagrams showing steps of a manufacturing method for a passive element chip.

Referring to FIG. 4A, an insulating layer 62 and an inductor 63 and a capacitor 64 are formed using metal wires of an aluminum alloy on a substrate 61 formed of an insulating material, such as glass or sapphire. The material used for the metal wires is not limited to an aluminum alloy, and it may be a copper alloy or a gold alloy. The deposition and etching of the insulating layer 62 and the deposition and etching of an aluminum alloy are repeated to form the inductors 63 and the capacitors 64. The insulating layer 62 and the metal wires are deposited using thin film depositing techniques in semiconductor processes, such as CVD, vacuum evaporation, and sputtering. The insulating layer 62 and the wires are processed by pattern forming techniques in semiconductor processes, such as photolithography and etching. In this example, the inductors 63 and the capacitors 64 are formed in the passive element chip 500; however, resistors may be formed as an alternative.

Figure 6:
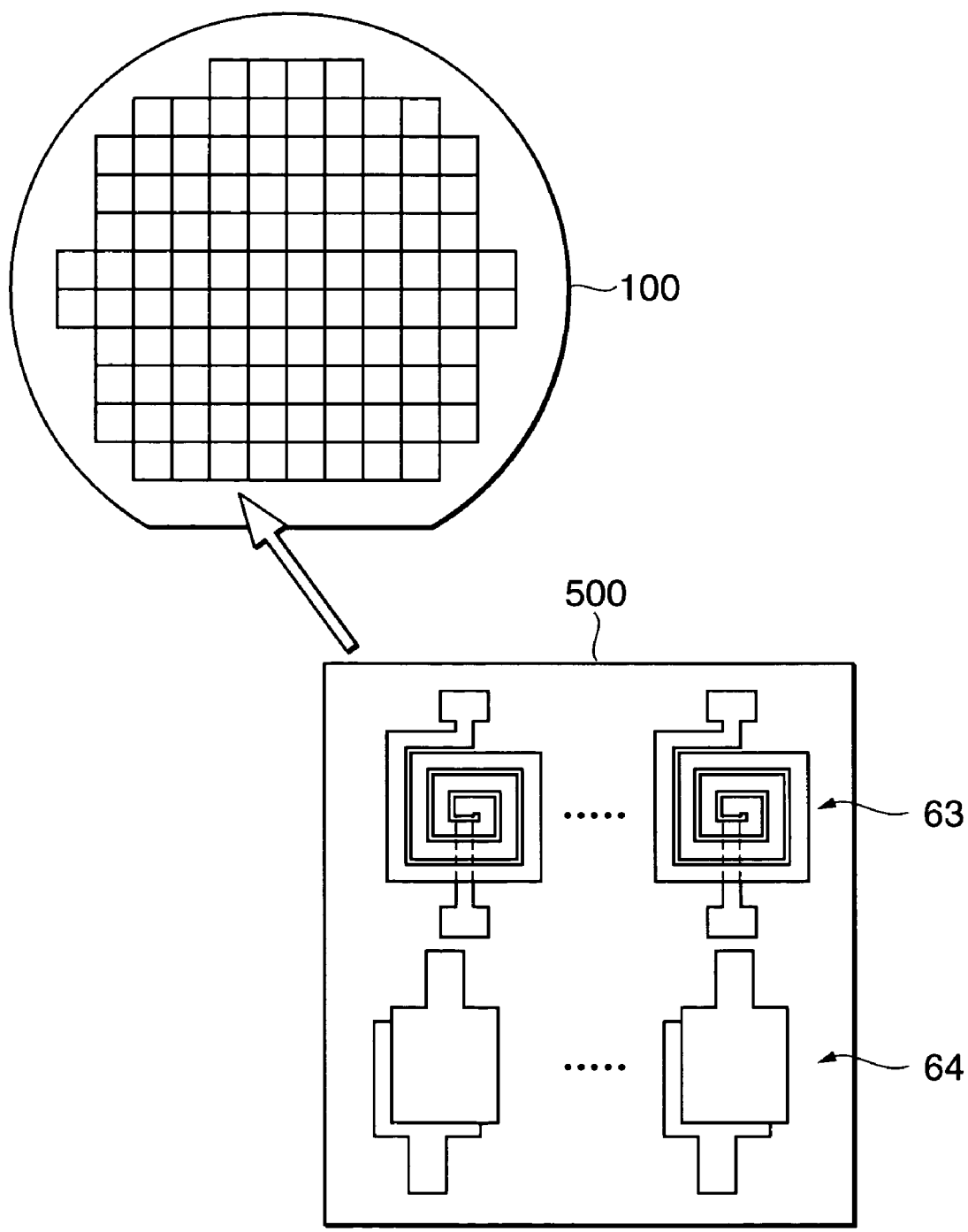
FIG. 6 shows configurations of a wafer and a passive element chip.

The inductors 63 are formed, for example, by laying metal wires in a spiral shape, as shown in FIG. 6. The capacitors 64 are created by, for example, forming metal wires into parallel plane electrodes and by laminating them into multiple layers. Adding an insulating member with a high dielectric constant between the parallel plane electrodes of the capacitor 64 permits an increased capacitance. Ideally, the substrate 61 has a high resistivity to improve a quality factor Q value of the inductors 63. Preferably, the substrate 61 is composed of, for example, an insulating substrate made of sapphire.

Figure 4B:
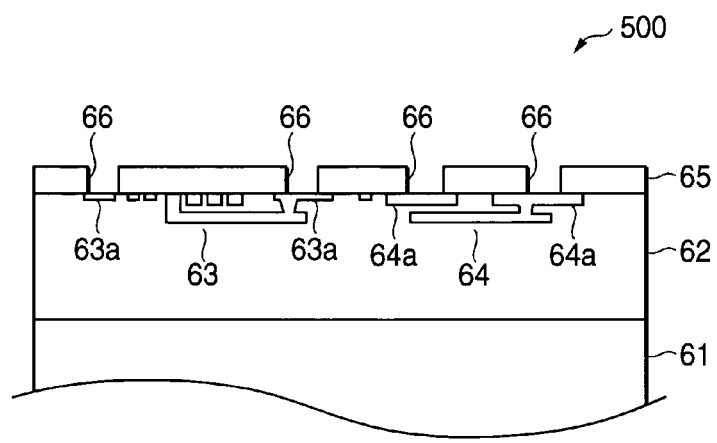

In the next step, as shown in FIG. 4B, a protective film 65 formed of a nitride film or the like is deposited on the insulating layer 62, and the protective film 65 is processed by photolithography and etching to form openings 66 in the protective film 65 so as to expose electrodes 63a and 64a (first electrodes) of the inductors 63 and the capacitors 64. This completes a bare passive element chip. The completed passive element chip can be mounted as it is in an application using bare chips.

Figure 4C:
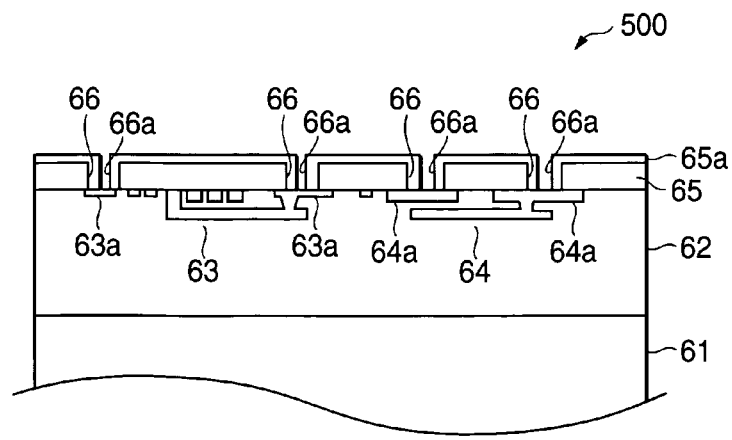
Figure 5A:
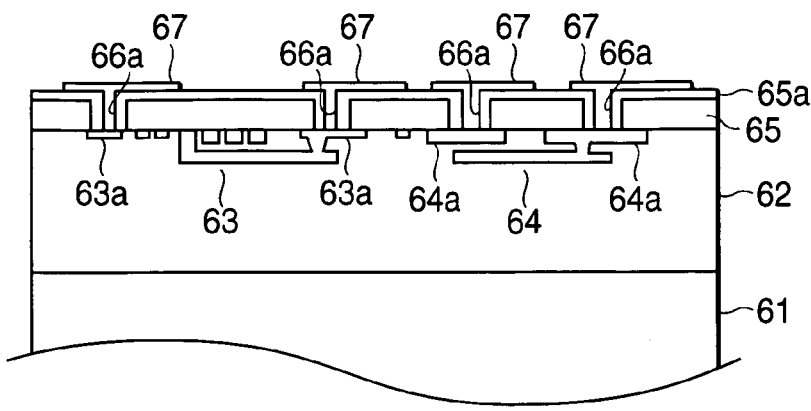
FIGS. 5A and 5B are explanatory diagrams showing steps of a manufacturing method for a passive element chip.
Figure 5B:
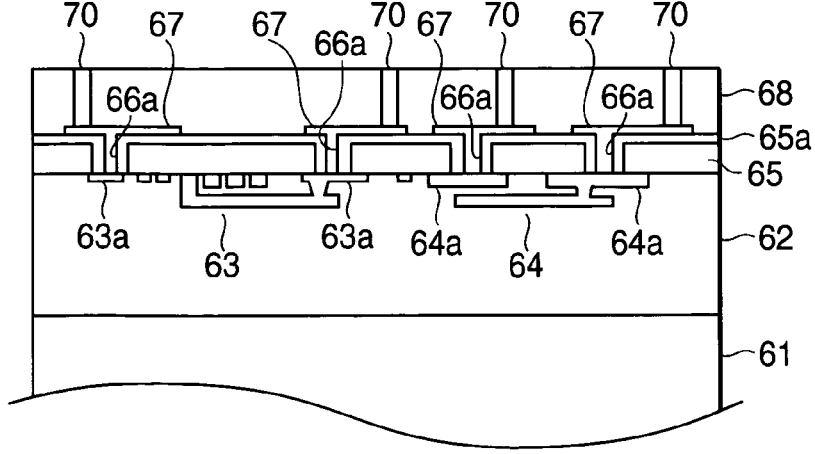

For the passive element chip of the WCSP specification, further processing is carried out. As shown in FIG. 4C, a photosensitive resin film 65 made of polyimide or the like is deposited, and the photosensitive resin film 65 is etched to form the openings 66a to expose the electrodes 63a and 64a. Then, as shown in FIG. 5A, an electrically conductive film of copper or the like is deposited over the photosensitive resin film 65a to cover the openings 66a. The electrically conductive film is then patterned to form wiring patterns 67 to be connected to the electrodes 63a of the inductors 63 and the electrodes 64a of the capacitors 64. Then, a resist pattern is formed over the wiring patterns 67 and the photosensitive resin film 65a, and metal posts 70 made of copper or the like are formed, as illustrated in FIG. 5B. The resist pattern is removed, and then the side surfaces of the wiring patterns 67, the photosensitive resin film 65a, and the metal posts 70 are sealed with a resin layer 68 such that the upper surfaces of the metal posts 70 are exposed.

In this embodiment, the intervals of the openings 66, which correspond to the wiring pitches of the bare chip, range from about 50 μm to about 100 μm, while the intervals of the metal posts 70 are larger (e.g., about 500 μm) than the intervals of the openings 66 (intervals of the exposed portions of the electrodes 63a). This involves rewiring to match the intervals of the openings 66 of about 50 μm to about 100 μm with the intervals of 500 μm of the electrode posts 70 through the intermediary of the wiring patterns 67. This arrangement permits easy wiring when installing WCSP passive element chips in a highly integrated module.

The passive element chip according to the present embodiment allows a wire width of about 1 μm and a multi-layer composed of insulating layers in a submicron order to be accomplished using thin-film depositing techniques, such as CVD, vacuum evaporation, and sputtering, and pattern forming techniques, such as photolithography and etching, in semiconductor processes involving silicon or the like. Thus, a reduced size and a higher density can be achieved.

Hitherto, when each passive element is installed in the form of a discrete chip component in a highly integrated module, the chip component itself occupies a large area and always requires soldering space, making it difficult to reduce its mounting area. Mounting a number of such discrete chips leads to a considerable increase in mounting area with an increasing number of chips, resulting in a large size of the highly integrated module. A passive element chip according to the present embodiment integrates a plurality of passive elements, which used to be mounted in the form of discrete chip components, into a single passive element chip. This arrangement makes it possible to reduce the size of the component itself, obviate the need for soldering space, and considerably reduce wire width. Hence, a mounting area can be dramatically reduced when mounting numerous passive elements, allowing the entire highly integrated module to be made smaller. Moreover, the number of components to be mounted can be reduce with a resultant reduced time required for fabricating a highly integrated module, since a plurality of passive elements that used to be mounted as discrete chip components can be mounted by being integrated in a single passive element chip.

The aforementioned passive element chips 500 can be produced on a wafer 100 shown in FIG. 6 by a semiconductor process. More specifically, the passive element chips 500 are arranged on the wafer 100 in a matrix pattern to make them at the same time, and then dice them into individual passive element chips 500. This allows mass production of the passive element chips 500, permitting reduced cost of the passive element chips 500 and also reduced cost of highly integrated modules accordingly.

[Combinations of Passive Components]

The following will describe combinations of inductors and capacitors in a passive element chip 500.

Figure 7:
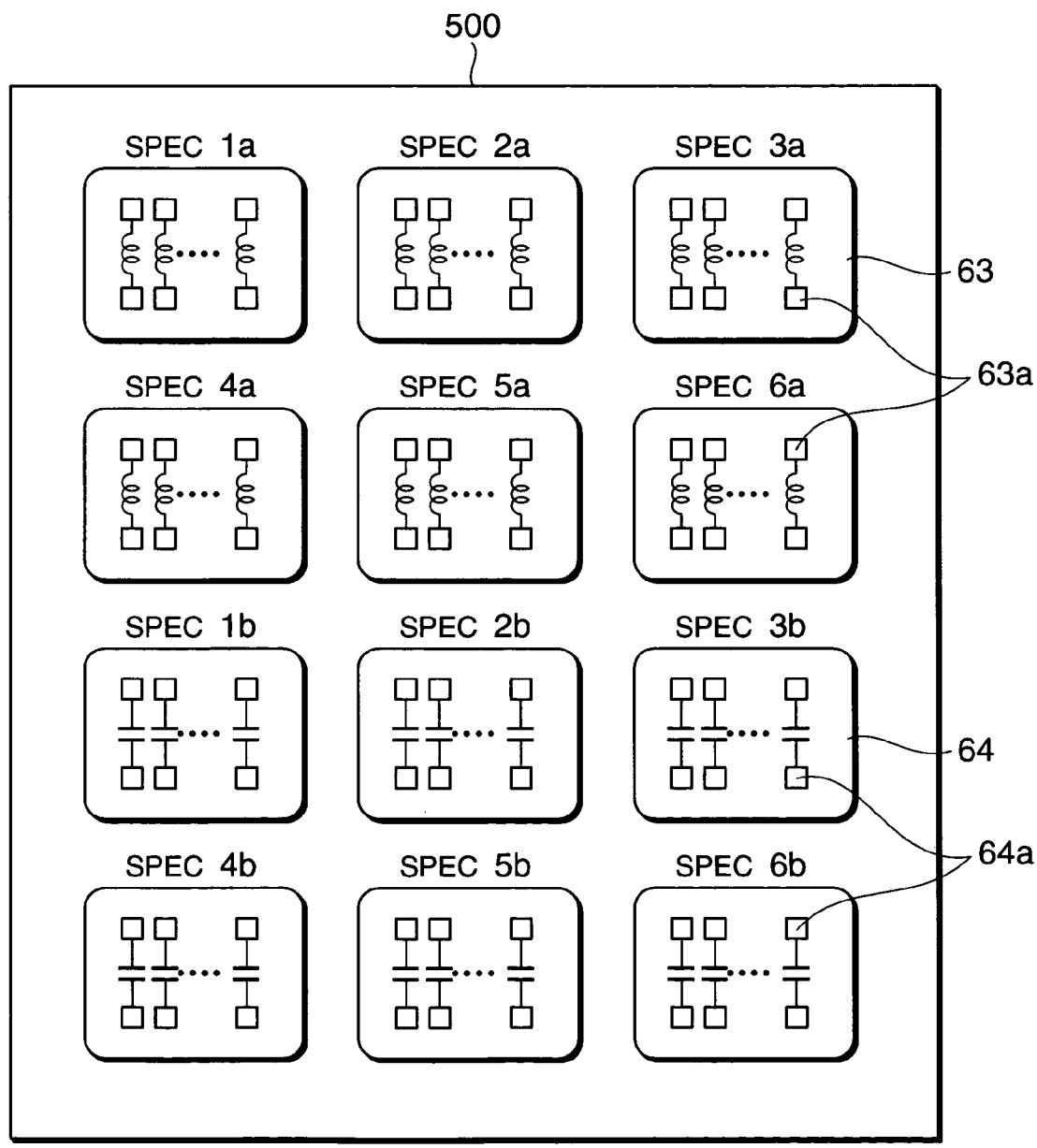
FIG. 7 shows an example of a combination of passive elements in a passive element chip.

FIG. 7 shows combinations of inductors and capacitors obtained when passive elements in passive element chips 500 are divided into groups including only the inductors 63 (inductor groups) and groups including only the capacitors 64 (capacitor groups). The inductor groups are further divided by a plurality of specifications 1a through 6a. The specifications include capacitance values, inductance values, and quality factor Q values. A group based on each specification has a plurality of inductors sharing the same specification. The capacitor groups are divided by a plurality of specifications 1b through 6b. A group based on each specification has a plurality of capacitors sharing the same specification. To mount the passive element chips 500 having passive elements divided into a plurality of groups in a highly integrated module, the electrodes 63a of the inductors 63 and the electrodes 64a of the capacitors 64 of the desired specifications are electrically connected through wiring patterns.

According to the passive element chips 500, the inductors 63 and the capacitors 64 of diverse specifications are grouped for each specification, so that a required number of inductors 63 and the capacitors 64 of desired specifications can be electrically connected according to each application.

This makes it possible to realize highly versatile passive element chips having an extremely wide range of applications. Achieving such a highly versatile passive element chip 500 would require a huge number of inductors 63 and capacitors 64 be produced for each specification, and a large number of the inductors 63 and the capacitors 64 would be incorporated per passive element chip. In contrast, integrating the inductors 63 and the capacitors 64 into the passive element chips 500 by utilizing semiconductor processes enables an enormous number of passive elements to be mounted in a single passive element chip.

Even if all the inductors 63 and the capacitors 64 shown in FIG. 7 have the same specifications, diverse specifications of inductors or capacitors can be created by appropriately selecting combinations of wires. In other words, the inductors 63 and the capacitors 64 of the same specifications can be used to create desired circuit configurations by appropriately connecting the inductors 63 and the capacitors 64, as necessary, in series or parallel.

The above description has been given of the case where inductors and capacitors are created in passive element chips. Alternatively, however, resistors may be added to the inductors and the capacitors. In this case, the specifications will include resistance values.

Figure 8:
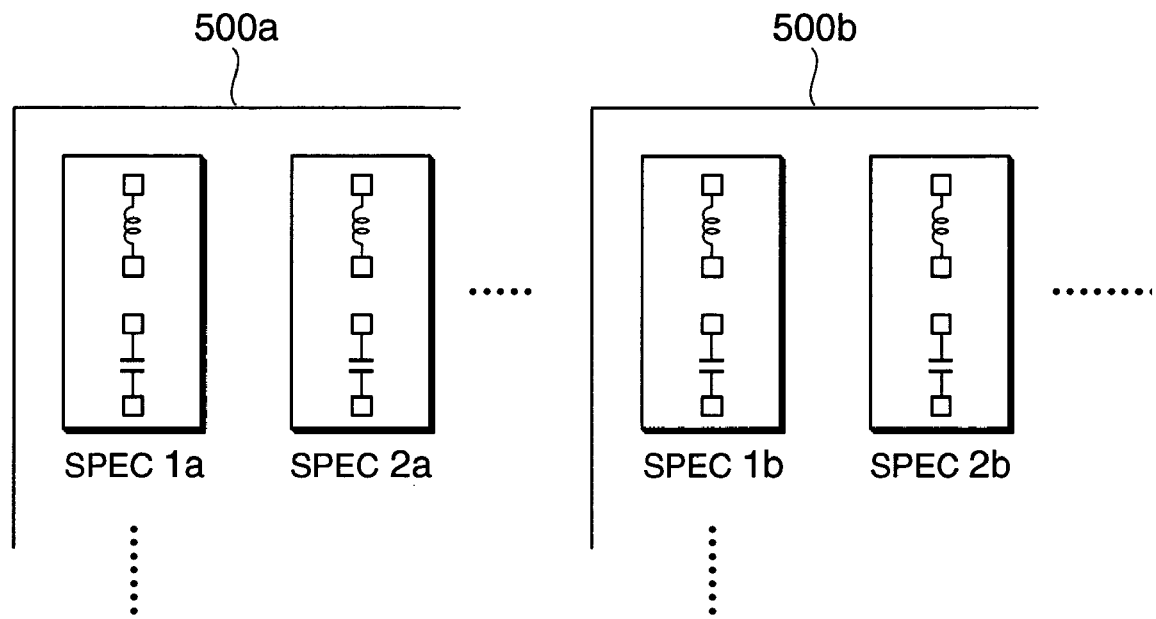
FIG. 8 shows examples of combinations of passive elements in a passive element chip.

FIG. 8 shows combinations of inductors and capacitors when passive element chips 500a for high frequencies and passive element chips 500b for applications other than high frequencies (e.g., for low frequencies) are formed on the wafer 100. The passive elements can be roughly divided into those for high frequency applications and those for other frequencies (low frequencies in this example). For instance, the inductors 63 are required to have an inductance value of about 10 nH and a Q value of 15 or more for high frequency applications, while they are required to have an inductance value of 1 μH or more and a Q value of 10 or less for low frequency applications. Therefore, the passive element chips 500a incorporating the passive elements for high frequencies and the passive element chips 500b incorporating the passive elements for low frequencies are separately fabricated. More specifically, the passive element chips 500a integrating passive elements exclusively used for high frequencies and the passive element chips 500b integrating passive elements exclusively used for low frequencies are separately fabricated. Preferably, the passive elements in the passive element chips 500a and 500b, respectively, are laid out in regions based on specifications, as in the case illustrated in FIG. 7. In this case, the passive elements for high frequency applications and the passive elements for low frequency applications are separately formed in the passive element chips 500a and 500b, respectively. Alternatively, however, a plurality of passive elements formed on the same passive element chip may be divided into a group for high frequency applications and a group for low frequency applications.

The above description has been given of the case where inductors and capacitors are formed in passive element chips. Alternatively, however, resistors may be formed in addition to the inductors and the capacitors. In such a case, the specifications will include resistance values.

As described above, separately fabricating the passive element chips 500a dedicated to high frequency applications and the passive element chips 500b dedicated to low frequency applications on the wafer 100 allows the passive element chips 500a and 500b to be selected according to applications. Passive element chips of desired specifications can be effectively integrated in the passive element chips 500a and 500b, respectively. More specifically, using the passive element chips 500a enables a highly integrated module requiring a large number of passive elements for high frequencies to cover a required number of passive elements by fewer passive element chips 500a.

Figure 9:
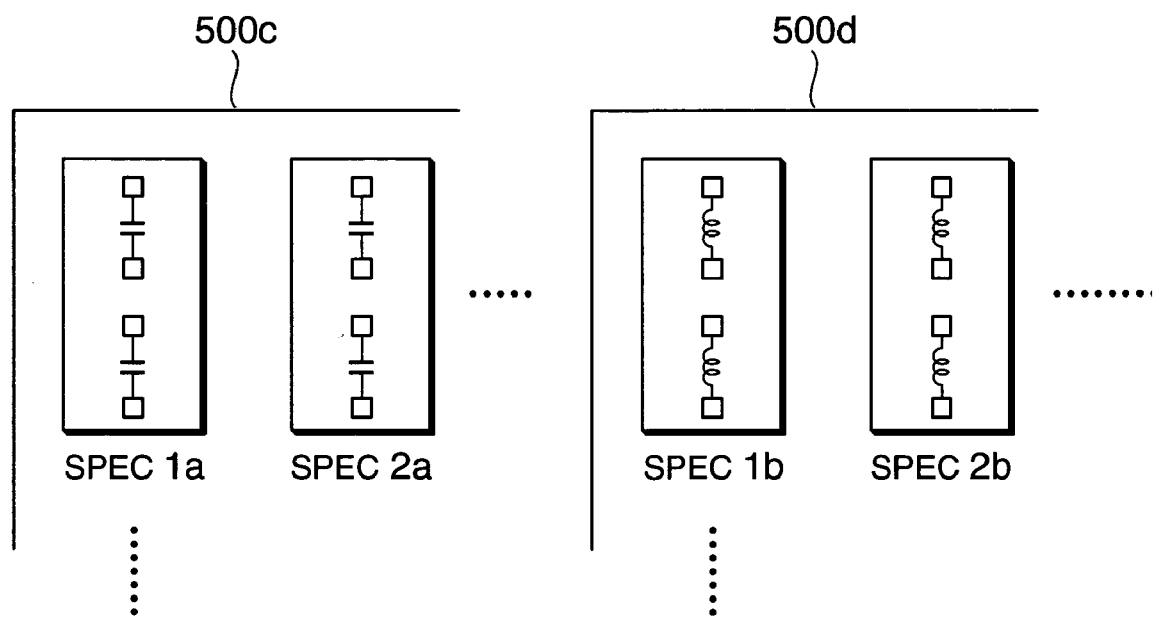
FIG. 9 shows examples of combinations of passive elements in a passive element chip.

FIG. 9 shows combinations of inductors and capacitors for forming passive element chips 500c exclusively designed for the inductors and passive element chips 500d exclusively designed for the capacitors on the wafer 100. Preferably, the passive element chips 500c and 500d are divided in regions by each specification, as those shown in FIG. 7. Some highly integrated modules use many inductors 63, while others use many capacitors 64. The passive element chips 500c dedicated to inductors are used for an application requiring many inductors 63, while the passive element chips 500d dedicated to capacitors are used for an application requiring many capacitors 64, thus making it possible to configure desired circuits using fewer semiconductor chips. The above description has been given of the case where the inductors 63 and the capacitors 64 are incorporated in the passive element chips 500a and 500b. Alternatively, however, only resistors may be built in the passive element chips.

The above description has been given of the case where the highly integrated modules are fabricated using a built-up structure. However, the passive element chips and semiconductor devices in accordance with the present invention can be also applied to a structure wherein the passive element chips and the semiconductor devices are embedded in a thermosetting resin, and the multiple layers are bonded. In the above examples, a polyimide-based or epoxy-based resin has been used for the insulating layers; however, a prepreg composed of a carbon fiber impregnated with a resin may alternatively be used. Furthermore, the highly integrated module in accordance with the present invention can also be applied for incorporating copper foil layers or components made by a film forming process.

[Applications]

FIG. 10 shows some applications that the highly integrated modules explained above are used.

FIG. 10A illustrates a SAW filter and I/O matching circuits 160a and 160b in a radio communication device, such as a cellular telephone. For instance, the matching circuits 160a and 160b can be integrated in the passive element chip 500 according to the present invention.

FIG. 10B shows a low-noise amplifier LNA, a power source RF choke circuit 161a, and I/O matching circuits 161b and 161c in a radio communication device, such as a cellular telephone. For instance, the RF choke circuit 161a, the I/O matching circuits 161b and 161c of the LNA can be integrated in the passive element chip 500.

FIG. 10C shows a power amplifier, power source RF choke circuit 162a, and an I/O matching circuit 162b in a radio communication device, such as a cellular telephone. For instance, the power source RF choke circuit 162a and the I/O matching circuit 162b can be integrated in the passive element chip 500.

FIG. 10D shows an EL driver IC for driving an EL panel and a power source boosting coil 163. For instance., the boosting coil 163 can be integrated in the passive element chip 500.

Figure 11:
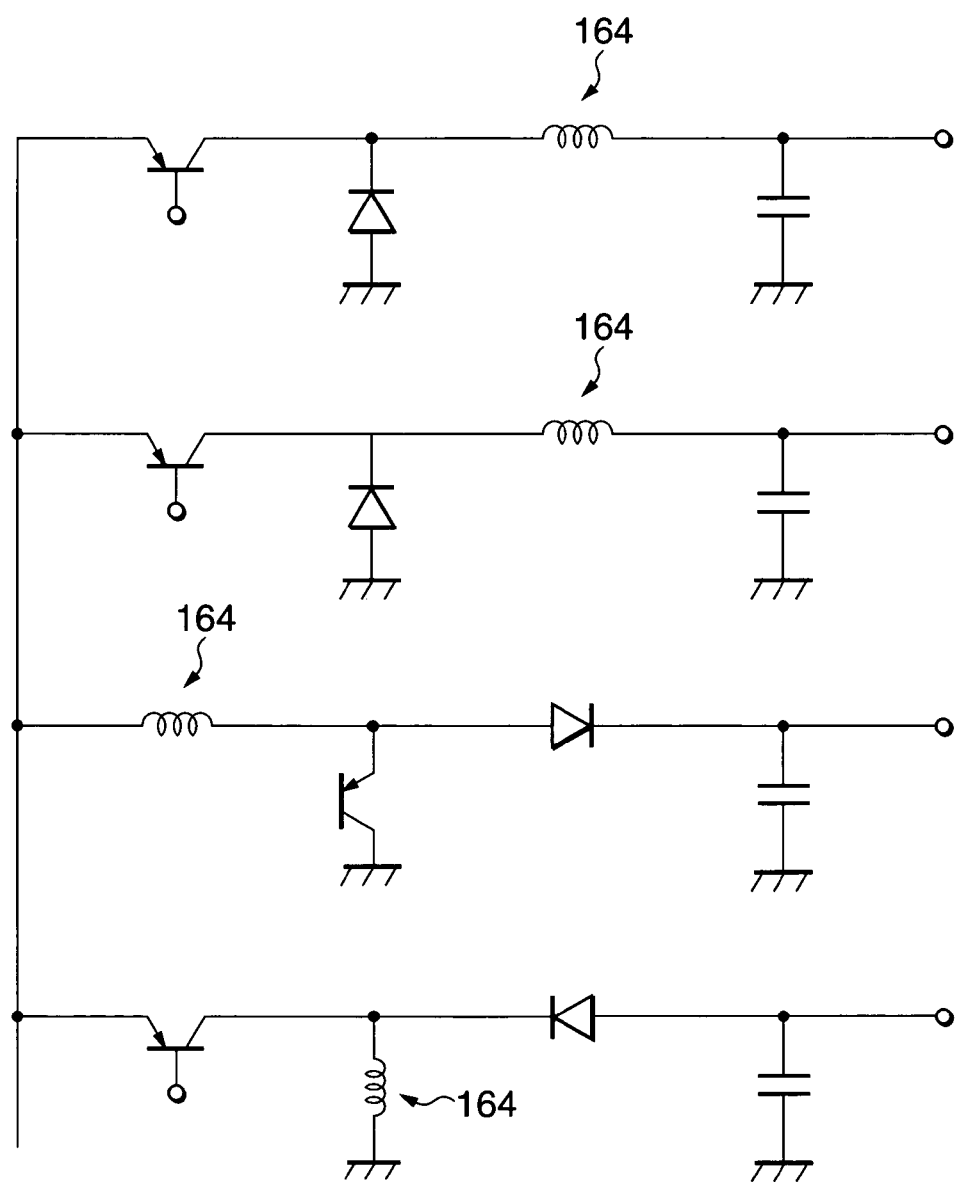
FIG. 11 shows an example of application.

FIG. 11 shows choke coils 164 used in a drive power circuit in an LCD panel. For example, the choke coils 164 may be integrated in the passive element chip 500.

Figure 12:
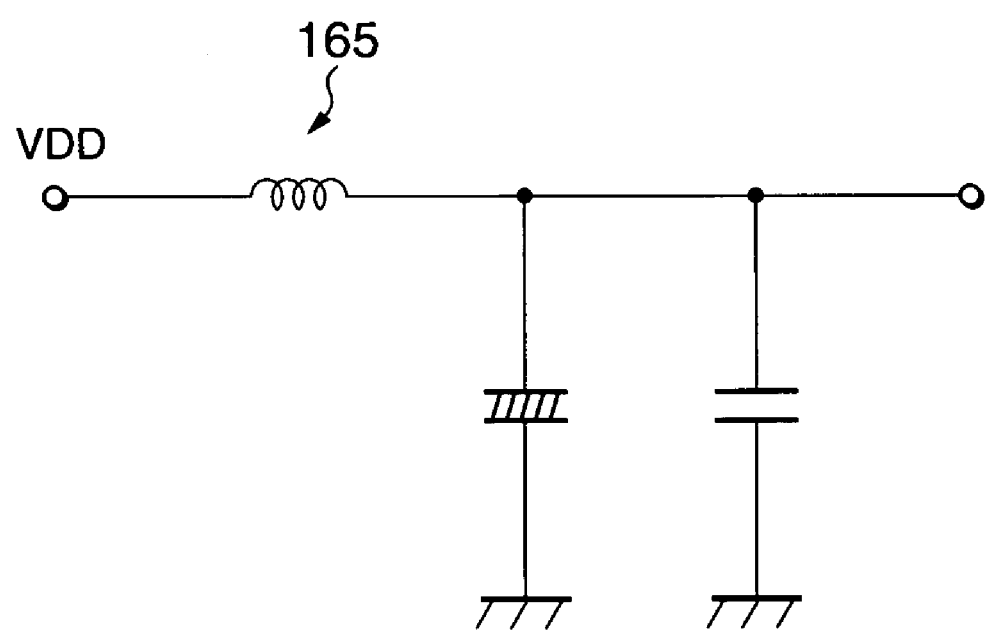
FIG. 12 shows another example of application.

FIG. 12 shows a decoupling choke coil 165 of a DC power source. For example, the decoupling choke coil 165 can be integrated in the passive element chip 500.

What is claimed is:

1. A passive element chip comprising:
   a substrate;
   an insulating layer having a first surface and a second surface opposite to the first surface, wherein the insulating layer is formed on the substrate, and wherein the second surface of the insulating layer is faced to the substrate;
   an inductor formed in the insulating layer by a first metal wire;
   a first electrode formed on the first surface of the insulating layer wherein the first electrode is coupled to the inductor;
   a capacitor formed in the insulating layer by a second metal wire, wherein the capacitor is isolated from the inductor;
   a second electrode formed on the first surface of the insulating layer, wherein the second electrode is coupled to the capacitor;
   a protective film formed on the first surface of the insulating layer, wherein the protective film has a first opening for exposing the first electrode and a second opening for exposing the second electrode;
   a first wiring pattern formed within the first opening; and
   a second wiring pattern formed within the second opening.

2. The passive element chip according to claim 1, wherein the plurality of passive elements includes passive elements of a plurality of specifications.

3. The passive element chip according to claim 2, wherein the specifications include a resistance value, a capacitance value, an inductance value, and a quality factor value.

4. The passive element chip according to claim 1, wherein the plurality of passive elements is divided into a plurality of groups having mutually different specifications.

5. The passive element chip according to claim 4, wherein the plurality of groups includes a group of high-frequency specifications and a group of low-frequency specifications.

6. The passive element chip according to claim 4, wherein the groups include a group composed only of inductors, a group composed only of capacitors, or a group composed only of resistors.

7. The passive element chip according to claim 1, wherein the plurality of passive elements includes only passive elements of high-frequency specifications or only passive elements of low-frequency specifications.

8. The passive element chip according to claim 1, wherein the plurality of passive elements is composed only of inductors or capacitors.

9. The passive element chip according to claim 1, wherein the passive elements are inductors formed of the metal wires spirally disposed.

10. The passive element chip according to claim 1, wherein the passive elements are capacitors in which the metal wires constitute parallel plane electrodes.

11. The passive element chip according to claim 1, further comprising:
    a resin layer formed on the protective film, wherein the resin layer has a third opening formed on a first metal post connecting to the first wiring pattern and a fourth opening formed a second metal post connecting to the second metal patter.

12. A highly integrated module comprising:
    a first substrate;
    an insulating film formed on the first substrate;
    a passive element chip within the insulating film and being formed on the first substrate, and
    a semiconductor chip within the insulating film and being formed on the first substrate;
    wherein the passive element chip comprises:
    a second substrate different from the first substrate;
    an insulating layer formed on the second substrate;
    an inductor formed in the insulating layer by a first metal wire;
    a capacitor formed in the insulating layer by a second metal wire, with the capacitor being isolated from the inductor; and
    a protective film formed on the insulating layer.

13. The highly integrated module according to claim 12, wherein the plurality of passive elements includes passive elements of a plurality of specifications.

14. The highly integrated module according to claim 12, wherein the plurality of passive elements is divided into a plurality of groups having mutually different specifications.

15. The highly integrated module according to claim 12, wherein the plurality of passive elements includes only passive elements of high-frequency specifications or only passive elements of low-frequency specifications.

16. The highly integrated module according to claim 12, wherein the plurality of passive elements is composed only of inductors or capacitors.

17. The highly integrated module according to claim 12, wherein the passive elements are inductors formed of the metal wires spirally disposed.

18. The highly integrated module according to claim 12, wherein the passive elements are capacitors in which the metal wires constitute parallel plane electrodes.

* * * * *